(12) United States Patent
Backfolk et al.

(10) Patent No.: US 12,325,960 B2
(45) Date of Patent: Jun. 10, 2025

(54) COATED PAPER SUBSTRATE SUITABLE FOR METALLIZATION

(71) Applicant: Stora Enso OYJ, Helsinki (FI)

(72) Inventors: Kaj Backfolk, Villmanstrand (FI); Isto Heiskanen, Imatra (FI); Katja Lyytikäinen, Imatra (FI)

(73) Assignee: Stora Enso OYJ, Helsinki (FI)

( * ) Notice: Subject to any disclaimer, the term of this patent is extended or adjusted under 35 U.S.C. 154(b) by 88 days.

(21) Appl. No.: 17/996,940

(22) PCT Filed: May 6, 2021

(86) PCT No.: PCT/IB2021/053830
§ 371 (c)(1),
(2) Date: Oct. 24, 2022

(87) PCT Pub. No.: WO2021/224839
PCT Pub. Date: Nov. 11, 2021

(65) Prior Publication Data
US 2023/0131438 A1    Apr. 27, 2023

(30) Foreign Application Priority Data
May 7, 2020 (SE) .................. 2050524-4

(51) Int. Cl.
| | | |
|---|---|---|
| *D21H 19/34* | (2006.01) | |
| *B32B 29/00* | (2006.01) | |
| *B32B 33/00* | (2006.01) | |
| *B65D 65/42* | (2006.01) | |
| *D21H 19/08* | (2006.01) | |
| *D21H 19/72* | (2006.01) | |
| *D21H 23/54* | (2006.01) | |
| *D21H 23/56* | (2006.01) | |
| *D21H 27/10* | (2006.01) | |
| *C08B 11/00* | (2006.01) | |
| *C08L 1/26* | (2006.01) | |
| *C08L 1/28* | (2006.01) | |
| *C09D 101/26* | (2006.01) | |
| *C09D 101/28* | (2006.01) | |
| *C23C 14/14* | (2006.01) | |
| *C23C 16/02* | (2006.01) | |
| *C23C 16/06* | (2006.01) | |
| *D21H 11/16* | (2006.01) | |
| *D21H 11/18* | (2006.01) | |
| *D21H 19/52* | (2006.01) | |

(52) U.S. Cl.
CPC ............ *D21H 19/34* (2013.01); *B32B 29/00* (2013.01); *B32B 33/00* (2013.01); *B65D 65/42* (2013.01); *D21H 23/54* (2013.01); *D21H 23/56* (2013.01); *D21H 27/10* (2013.01); *B32B 29/005* (2013.01); *B32B 2255/12* (2013.01); *B32B 2255/205* (2013.01); *B32B 2255/26* (2013.01); *B32B 2255/28* (2013.01); *B32B 2262/062* (2013.01); *B32B 2307/538* (2013.01); *B32B 2307/718* (2013.01); *B32B 2439/70* (2013.01); *B32B 2553/00* (2013.01); *C08B 11/00* (2013.01); *C08L 1/26* (2013.01); *C08L 1/28* (2013.01); *C09D 101/26* (2013.01); *C09D 101/28* (2013.01); *C23C 14/14* (2013.01); *C23C 16/0272* (2013.01); *C23C 16/06* (2013.01); *D21H 11/16* (2013.01); *D21H 11/18* (2013.01); *D21H 19/08* (2013.01); *D21H 19/52* (2013.01); *D21H 19/72* (2013.01); *Y10T 428/253* (2015.01); *Y10T 428/273* (2015.01); *Y10T 428/277* (2015.01); *Y10T 428/31703* (2015.04); *Y10T 428/31993* (2015.04)

(58) Field of Classification Search
None
See application file for complete search history.

(56) References Cited

U.S. PATENT DOCUMENTS

| | | | |
|---|---|---|---|
| 3,113,888 A | | 12/1963 | Gold et al. |
| 4,434,259 A | | 2/1984 | Gold et al. |
| 4,994,112 A | * | 2/1991 | Majewicz ............ D21H 19/52 |
| | | | 106/774 |
| 5,219,619 A | | 6/1993 | Trouve et al. |
| 5,298,335 A | * | 3/1994 | Reed .................. D21H 19/62 |
| | | | 428/513 |
| 5,334,449 A | | 8/1994 | Bergmann et al. |
| 6,123,996 A | * | 9/2000 | Larsson ............ C09D 201/00 |
| | | | 427/361 |

(Continued)

FOREIGN PATENT DOCUMENTS

| | | |
|---|---|---|
| CA | 2124576 A1 | 6/1993 |
| CN | 101952508 A | 1/2011 |

(Continued)

OTHER PUBLICATIONS

Machine Translation of RU-2021412-C1, Oct. 1994 (Year: 1994).*

(Continued)

*Primary Examiner* — Jeffrey A Vonch
(74) *Attorney, Agent, or Firm* — Greer, Burns & Crain, Ltd.

(57) ABSTRACT

The present invention is directed to a coated paper substrate that is particularly suitable for metallization and other nano-coatings that provide barrier properties and are applied using vacuum deposition techniques. The invention is also directed to a process for preparing the coated paper substrate. The invention is also directed to a packaging material comprising the coated paper substrate.

20 Claims, No Drawings

(56) References Cited

U.S. PATENT DOCUMENTS

| | | | |
|---|---|---|---|
| 6,703,497 B1* | 3/2004 | Ladouce | C08B 11/00 536/84 |
| 8,377,563 B2 | 2/2013 | Miyawaki et al. | |
| 10,358,772 B2 | 7/2019 | Heiskanen et al. | |
| 10,927,504 B2 | 2/2021 | Backfolk et al. | |
| 2003/0199617 A1 | 10/2003 | Larsson et al. | |
| 2004/0200593 A1* | 10/2004 | Koskinen | D21G 1/00 162/158 |
| 2005/0103458 A1 | 5/2005 | Ono et al. | |
| 2005/0251976 A1* | 11/2005 | Lipponen | D21G 1/006 28/100 |
| 2006/0122059 A1* | 6/2006 | Mathur | B41M 5/42 503/200 |
| 2009/0104431 A1* | 4/2009 | Kishida | D21H 19/36 428/323 |
| 2011/0223401 A1* | 9/2011 | Harlin | C23C 16/45555 427/250 |
| 2011/0259537 A1* | 10/2011 | Husband | D21D 1/20 162/26 |
| 2011/0277947 A1* | 11/2011 | Hua | D21H 21/10 162/149 |
| 2012/0043039 A1* | 2/2012 | Paltakari | D21H 17/24 428/401 |
| 2012/0132381 A1* | 5/2012 | Hentze | D21F 11/00 162/149 |
| 2012/0251818 A1* | 10/2012 | Axrup | D21H 27/10 428/326 |
| 2013/0017349 A1* | 1/2013 | Heiskanen | D21H 19/34 428/221 |
| 2013/0345415 A1* | 12/2013 | Trigiante | D21H 17/07 536/63 |
| 2014/0004340 A1* | 1/2014 | Saastamoinen | D21H 19/14 427/427 |
| 2014/0050922 A1* | 2/2014 | F. Chin | C09D 103/00 524/35 |
| 2014/0255688 A1* | 9/2014 | Salminen | C08J 5/18 264/294 |
| 2014/0302336 A1* | 10/2014 | Heiskanen | D21C 9/00 106/204.3 |
| 2015/0225590 A1* | 8/2015 | Iotti | C09D 101/04 106/217.6 |
| 2015/0368441 A1* | 12/2015 | Retsina | D21C 11/0007 428/375 |
| 2016/0016717 A1* | 1/2016 | Toubeau | D21H 17/24 220/62.13 |
| 2017/0183555 A1* | 6/2017 | Lillandt | D21H 11/18 |
| 2017/0267009 A1* | 9/2017 | Aspler | D21H 11/18 |
| 2017/0284030 A1* | 10/2017 | Svending | D21H 17/28 |
| 2017/0342661 A1* | 11/2017 | Aulin | D21H 23/50 |
| 2018/0066073 A1* | 3/2018 | Spender | C08B 3/20 |
| 2018/0171559 A1* | 6/2018 | Hipps, Sr. | D21H 19/34 |
| 2018/0245289 A1* | 8/2018 | Heiskanen | D21H 19/36 |
| 2018/0311940 A1* | 11/2018 | Toft | B65D 65/40 |
| 2018/0319957 A1* | 11/2018 | Jin | C08B 15/04 |
| 2019/0024318 A1* | 1/2019 | Backfolk | D21H 11/18 |
| 2019/0078261 A1* | 3/2019 | Saiki | D21H 19/82 |
| 2019/0127557 A1* | 5/2019 | Onogi | C08B 11/12 |
| 2019/0218412 A1* | 7/2019 | Ben Shalom | C09D 7/65 |
| 2019/0226146 A1* | 7/2019 | Pihko | D21H 11/18 |
| 2021/0155716 A1* | 5/2021 | Pahimanolis | C08H 8/00 |
| 2021/0207324 A1* | 7/2021 | Knöös | D21H 27/10 |
| 2022/0389261 A1* | 12/2022 | Koppolu | B82Y 40/00 |
| 2023/0122933 A1* | 4/2023 | Nyman | D21H 17/26 162/123 |

FOREIGN PATENT DOCUMENTS

| | | | | |
|---|---|---|---|---|
| CN | 103266536 A | * | 8/2013 | |
| CN | 103590281 A | * | 2/2014 | |
| CN | 107709663 A | | 2/2018 | |
| CN | 108708207 A | * | 10/2018 | |
| CN | 109415875 A | | 3/2019 | |
| CN | 110205866 A | * | 9/2019 | D21H 19/14 |
| CN | 110241658 A | * | 9/2019 | D21H 17/23 |
| EP | 2725137 A1 | * | 4/2014 | |
| JP | 2002371492 A | * | 12/2002 | |
| JP | 2013147001 A | * | 8/2013 | |
| JP | 2015196907 A | * | 11/2015 | |
| KR | 2019092877 A | * | 8/2019 | C08J 5/18 |
| RU | 2021412 C1 | * | 10/1994 | |
| WO | 9311299 | | 6/1993 | |
| WO | 0206585 A1 | | 1/2002 | |
| WO | WO-2010066905 A1 | * | 6/2010 | |
| WO | 2012066308 A2 | | 5/2012 | |
| WO | WO-2016185332 A1 | * | 11/2016 | B32B 29/005 |
| WO | 2017075417 A1 | | 5/2017 | |
| WO | WO-2018078558 A1 | * | 5/2018 | B29C 33/56 |
| WO | WO-2018116223 A1 | * | 6/2018 | B32B 29/02 |
| WO | WO-2018193314 A1 | * | 10/2018 | D21C 9/004 |
| WO | WO-2018211441 A1 | * | 11/2018 | B32B 23/06 |
| WO | WO-2019198040 A1 | * | 10/2019 | B32B 15/12 |
| WO | WO-2020111025 A1 | * | 6/2020 | |

OTHER PUBLICATIONS

Khan et al., Production and Properties of Nanocellulose-Reinforced Methylcellulose-Based Biodegradable Films, Jul. 2010, Journal of Agricultural and Food Chemistry, vol. 58, No. 13, pp. 7878-7885 (Year: 2010).*

Silvério et al., Mechanical, thermal, and barrier properties of methylcellulose/cellulose nanocrystals nanocomposites, Jan. 2015, Polímeros, vol. 24, No. 6, pp. 683-688 (Year: 2016).*

Raabe et al., Strength improvement of hydroxypropyl methylcellulose/starch films using cellulose nanocrystals, Oct. 2017, CERNE, vol. 23, No. 4, pp. 423-434 (Year: 2017).*

Machine Translation of CN-108708207-A, Oct. 2018 (Year: 2018).*

Paunonen, Strength and barrier enhancements of cellophane and cellulose derivative films: a Review, 2013, BioResources, vol. 8, Issue 2, pp. 3098-3121 (Year: 2013).*

Aulin et al., Multilayered Alkyd Resin/Nanocellulose Coatings for Use in Renewable Packaging Solutions with a High Level of Moisture Resistance, Jan. 2013, Industrial & Engineering Chemistry Research, vol. 52, Issue 7, pp. 2582-2589 (Year: 2013).*

Vuoti et al., Solvent impact on esterification and film formation ability of nanofibrillated cellulose, Aug. 2013, Cellulose, vol. 20, pp. 2359-2370 (Year: 2013).*

Cunha et al., Preparation of Double Pickering Emulsions Stabilized by Chemically Tailored Nanocelluloses, Jul. 2014, Langmuir, vol. 30, Issue 31, pp. 9327-9335 (Year: 2014).*

Eyley et al., Surface modification of cellulose nanocrystals, Jun. 2014, Nanoscale, vol. 6, pp. 7764-7779 (Year: 2014).*

Nair et al., High performance green barriers based on nanocellulose, Nov. 2014, Sustainable Chemical Processes, vol. 2, No. 23 (Year: 2014).*

Llzundia et al., Cu-coated cellulose nanopaper for green and low-cost electronics, Apr. 2016, Cellulose, vol. 23, pp. 1997-2010 (Year: 2016).*

Hu et al., Dried and Redispersible Cellulose Nanocrystal Pickering Emulsions, Jan. 2016, ACS Macro Letters, vol. 5, Issue 2, pp. 185-189 (Year: 2016).*

Gicquel et al., Cellulose nanocrystals as new bio-based coating layer for improving fiber-based mechanical and barrier properties, Nov. 2016, Journal of Materials Science, vol. 52, pp. 3048-3061 (Year: 2016).*

Afra et al., Cellulose nanofibils as coating material and its effects on paper properties, Dec. 2016, Progress in Organic Coatings, vol. 101, pp. 455-460 (Year: 2016).*

Mazhari Mousavi et al., Cellulose nanofiber/carboxymethyl cellulose blends as an efficient coating to improve the structure and barrier properties of paperboard, Apr. 2017, Cellulose, vol. 24, pp. 3001-3014 (Year: 2017).*

Kedzior et al., Cellulose Nanocrystals and Methyl Cellulose as Costabilizers for Nanocomposite Latexes with Double Morphology, Sep. 2017, ACS Sustainable Chemistry & Engineering, vol. 5, Issue 11, pp. 10509-10517 (Year: 2017).*

(56) References Cited

OTHER PUBLICATIONS

Herrera et al., Barrier and mechanical properties of plasticized and cross-linked nanocellulose coatings for paper packaging applications, Jul. 2017, Cellulose, vol. 24, pp. 3969-3980 (Year: 2017).*

Mazhari Mousavi et al., Application of cellulose nanofibril (CNF) as coating on paperboard at moderate solids content and high coating speed using blade coater, Sep. 2018, Progress in Organic Coatings, vol. 122, pp. 207-218 (Year: 2018).*

Tyagi et al., High performance nanocellulose-based composite coatings for oil and grease resistance, May 2018, Cellulose, vol. 25, pp. 3377-3391 (Year: 2018).*

Xia et al., Highly transparent 100% cellulose nanofibril films with extremely high oxygen barriers in high relative humidity, May 2018, Cellulose, vol. 25, pp. 4057-4066 (Year: 2018).*

Lyytikäinen et al., Temperature-dependent interactions between hydrophobically modified ethyl(hydroxyethyl)cellulose and methyl nanocellulose, Jul. 2019, Cellulose, vol. 26, pp. 7079-7087 (Year: 2019).*

Tyagi et al., Nanocellulose-based multilayer barrier coatings for gas, oil, and grease resistance, Feb. 2019, Carbohydrate Polymers, vol. 206, pp. 281-288 (Year: 2019).*

Shanmugam et al., Engineering surface roughness of nanocellulose film via spraying to produce smooth substrates, Feb. 2020, Colloids and Surfaces A: Physicochemical and Engineering Aspects, vol. 589, p. 124396 (Year: 2020).*

Extended European Search Report from corresponding European application No. 21800244.2 dated Apr. 15, 2024.

International Search Report from corresponding PCT application No. PCT/IB2021/053830, mailed on Jun. 9, 2021.

Fengel, D., Ultrastructural behaviour of cell wall polysaccharides, TAPPI, 1970, vol. 53, No. 3, pp. 497-503. (Abstract only).

Chinga-Carraso, Gary, Cellulose fibres, nanofibrils and microfibrils: The morphological sequence of MFC components from a plant physiology and fibre technology point of view, Chinga-Carrasco Nanoscale Research Letters, 2011, 6:417.

* cited by examiner

COATED PAPER SUBSTRATE SUITABLE FOR METALLIZATION

This application is a U.S. National Phase under 35 U.S.C. § 371 of International Application No. PCT/IB2021/053830 filed May 6, 2021, which claims priority under 35 U.S.C. §§ 119 and 365 to Swedish Application No. 2050524-4 filed May 7, 2020.

TECHNICAL FIELD

The present invention is directed to a coated paper substrate that is particularly suitable for metallization and other nano-coatings that provide barrier properties and are applied using vacuum deposition techniques. The invention is also directed to a process for preparing the coated paper substrate. The invention is also directed to a packaging material comprising the coated paper substrate.

BACKGROUND

Packages used for sensitive objects need to have sufficient barrier properties, Especially some dry or liquid food products requires high barrier in order to protect the packed and to for example extend the shelf life. Typically, aluminum or film-forming polymers such as latex or thermoplastic polymers is used for these purposes and generally provides sufficient properties with regard to penetration or diffusion of oil or greases and/or aromas or gas, such as oxygen. The aluminum or film-forming polymers also provide an enhanced water vapor barrier, which is important to barrier and package functionality in high relative humidity conditions or to reduce evaporation of packed liquid products. The film-forming polymers also protect the board from wetting in liquid packaging products.

However, one issue with the use of aluminum and especially laminates that contain aluminum foil is that it poses an environmental challenge, may be a problem in the recycling process and, depending on the amount used, may lead to the packaging material not being compostable. It is therefore desirable to use as small amount of aluminum as possible. However, at the same time it is essential to maintain the barrier properties of the packaging material.

It is known in the art to provide nano-coatings that can be organic or inorganic, such as ceramic or metal nano-coatings. The nano-coatings are very thin, such as from about 0.1 nm to about 100 nm in thickness. For example, metallized surfaces using a very small amount of metal or metal oxides, such as aluminum or $Al_2O_3$, AlOx, MgO or ZnO. For example, atomic layer deposition (ALD), dynamic compound deposition (DCD), chemical vapor deposition (CVD), such as plasma CVD, physical vapor deposition (PVD) and metal plasma-deposition are techniques suitable to provide a small amount of metal on a surface. However, it remains essential that the packaging material, when provided with a nano-coating such as being metallized, can maintain barrier properties and is sufficiently crack-resistant.

One issue with film-forming polymers such as latex and thermoplastic fossil-based polymers is that the packaging material obtained is typically not considered as a monomaterial and issues may arise with recycling. A further problem with many film-forming polymers is that the film-forming polymers are usually provided in the form of aqueous solutions or dispersions. The water content of the solutions or dispersions may disrupt the paper substrate. Hydrophilic cellulose materials typically provide barrier properties to oxygen, but are sensitive to water and water vapour.

Therefore, a substrate adapted such that a very small amount of nano-coating can be applied.

SUMMARY OF THE INVENTION

It has surprisingly been found that some or all of the aforementioned problems can be solved by providing a coated paper substrate said paper substrate having a grammage in the range of from 15 $g/m^2$ to 100 $g/m^2$, said coating comprising a cellulose ether, wherein the coated surface has PPS smoothness in the range of from 0.1 to 8.0 µm, measured at 1.0 MPa.

More specifically, it has surprisingly been found that the cellulose ether coating provides a smooth surface, particularly on a nanoscale level, that facilitates providing nano-coatings, such as metallized surfaces, using a very small amount of metal, such as aluminum. For example, atomic layer deposition (ALD), dynamic compound deposition (DCD), chemical vapor deposition (CVD), physical vapor deposition (PVD) and metal plasma-deposition are techniques useful for providing barrier properties using only very small amounts of metal.

Nanoscale roughness of a paper substrate can be determined using methods known in the art. For example, the roughness can be determined by atomic force microscopy or by use of scanning electron microscopy.

The nanoscale surface roughness of the paper substrate according to the present invention is low, i.e. the surface is very smooth on a nanoscale, Roughness is often described as closely spaced irregularities. Nanoscale roughness can be measured by atomic force microscopy. For example, an area of the cellulose ether coated substrate (i.e. before any nano-coating has been applied), preferably an area of between 5 um×5 um and 100 um×100 urn can be can observed using atomic force microscopy. The surface structure, i.e. peaks and valleys can be determined and the root-mean-square (RMS) roughness or peak-to-valley height parameters can be calculated, quantifying the nanoscale surface roughness (Peltonen J. et al. Langmuir, 2004, 20, 9428-9431). For the cellulose ether coated substrates according to the present invention, the RMS determined accordingly is generally below 100 nm, preferably below 80 nm.

PPS (Parker Print Surf) smoothness can be determined according to ISO 8791-4.

The paper substrate according to the present invention may comprise multiple layers. For example, the paper substrate may comprise one layer with a low amount of microfibrillated cellulose and one layer with a high amount of microfibrillated cellulose. Advantageously, one layer of the paper substrate is a film comprising a high amount of microfibrillated cellulose.

DETAILED DESCRIPTION

The microfibrillated cellulose (MFC) used according to the present invention can be prepared using methods known in the art.

A paper substrate having a grammage in the range of from 15 $g/m^2$ to 100 $g/m^2$ can be prepared using methods known in the art. Preferably, the grammage of the paper substrate is in the range of from 15 $g/m^2$ to 50 $g/m^2$, more preferably in the range of from 20 $g/m^2$ to 45 $g/m^2$. The paper substrate may for example be glassine paper, grease-proof paper or nanopaper, provided that it has a grammage in the defined range. The paper substrate may for example be prepared from pulp, such as kraft pulp prepared from softwood and/or hardwood. The pulp used in producing the paper substrate may be refined and the paper substrate may be prepared for a mixture of pulp refined to various degrees. For example, the paper substrate may prepared from 10-20 wt % of low refined pulp (having for example Schopper Riegler degree, SR, in the range of 15-25°), mixed with 40-60 wt % of highly refined pulp (for example having SR 70°) and 10-40 wt % microfibrillated cellulose (MFC).

Preferably, the paper substrate according to the present invention comprises less than a total of 5 wt % plastic material or other fossil-based material.

Preferably, the paper substrate comprises at least 60% by weight of microfibrillated cellulose, more preferably at least 70% by weight of microfibrillated cellulose.

The MFC used in the paper substrate according to the present invention may be native or modified (such as for example PCC coated MFC) and may be a mix of native and modified MFC as well as a mix of native MFC and different types of modified MFC. The MFC may be produced from pulp, such as from dissolving pulp.

The paper substrate, prior to coating, preferably has barrier properties such that the Gurley Hill porosity value of the film is higher than 4000 s/100 ml, preferably higher than 6000 s/100 ml and most preferably higher than 10 000 s/100 ml. The Gurley Hill value can be determined using methods known in the art (ISO 5636-5).

The paper substrate may optionally be calendered prior to coating with cellulose ether, for example using soft-nip, belt calander or supercalander.

The coating using cellulose ether is carried out by coating methods known in the art.

Examples of cellulose ethers include diethylaminoethyl cellulose, ethyl cellulose, ethyl methyl cellulose, hydroxyethyl cellulose, hydroxyethyl methyl cellulose, hydroxypropyl cellulose and methyl cellulose. The cellulose ether used for the coating is preferably methyl cellulose or ethyl cellulose. Preferably, the cellulose ether has a degree of substitution (DS) in the range of from 0.5 to 2.5, preferably lower than 2.1. The cellulose ether may be pre-treated in one or more high-shearing steps, such as using a high pressure fluidizer or homogenizer.

The cellulose ether may be in fibrillated form, such as methylated nanocellulose. Such cellulose ethers may for example be prepared as disclosed in US20180319957A1.

The amount of cellulose ether applied to the paper substrate in the coating step is preferably in the range of from 0.1 g/m² to 8 g/m², preferably from 1 g/m² to 6 g/m². The cellulose ether coating can be provided in one or more layers, on one or both sides of the paper substrate.

The cellulose ether is preferably applied in the form of a solution, dispersion, emulsion or foam. The cellulose ether may be applied in the form of particles, i.e. the cellulose ether may be provided in the form of a dispersion comprising dispersed cellulose ether in the form of particles. Such dispersion may also comprise dissolved cellulose ether.

Preferably, the cellulose ether is provided in the form of a solution, dispersion, emulsion or foam in a non-aqueous solvent, preferably an organic solvent. Preferably, at least 80 wt %, more preferably at least 90 wt %, even more preferably at least 95 wt % of the solvent used in said suspension, solution, emulsion or foam is non-aqueous. Preferably, the solvent used has a dielectric constant less than 50. Suitable solvents include ethanol, isopropanol, methyl ethyl ketone and mixtures thereof.

Preferably, the viscosity, determined using a Brookfield viscosimeter at a rotational speed of 100 rpm and using a RV Series Viscometer and spindle number 3, of the cellulose ether solution, dispersion, emulsion or foam used for the coating is less than 2000 mPas, more preferably less than 1000 mPas, most preferably less than 800 mPas.

The solution, dispersion, emulsion or foam comprising cellulose ether may comprise one or more than one ether. The cellulose ethers may be fibrillated or non-fibrillated. The solution, dispersion or emulsion may also comprise additives such as fillers and/or cross-linkers, such as citric acid. The concentration of cellulose ether in the solution, dispersion, emulsion or foam is preferably in the range of from 1 wt % to 99 wt %, more preferably in the range of from 5 wt % to 95 wt %, such as 5 wt % to 50 wt % or 10 wt % to 50 wt % or 20 wt % to 50 wt %, based on the weight of the cellulose ether and the total weight of the solution, dispersion, emulsion or foam.

When the cellulose ether coating is applied, the moisture content of the paper onto which the cellulose ether coating is applied is preferably less than 50 wt %, more preferably less than 20 wt %, most preferably less than 10 wt %, even more preferably less than 5 wt %.

After drying the cellulose ether coating, the moisture content of the coated paper substrate is less than 5 wt %, preferably less than 3 wt %, more preferably less than 2 wt %. After drying the cellulose ether coating, the remaining content of the solvent used in the suspension, dispersion, emulsion or foam of the cellulose ether is less than 5 wt % (based on the total weight of the coated substrate), preferably less than 3 wt %, more preferably less than 2 wt %, most preferably less than 1 wt %.

The contact angle between substrate and coating medium is preferably below 65 degrees more preferably below 45 degrees and even more preferably below 30 degrees, to ensure adequate wetting and film formation in the coating step.

After applying the cellulose ether coating, the coating is dried using methods known in the art. Preferably, the coating is applied with rod, gravure, reverse gravure, smooth rolls or blade coating. The coating may also be applied by curtain coating, foam coating, spray coating, blade coating or e.g. by printing.

The coated paper substrate may optionally be calendered after coating with cellulose ether, for example using soft-nip belt calander or supercalander.

Optionally, the cellulose ether coating step can be repeated to provide several coating layers. The coating solution, dispersion or emulsion used for the optional subsequent coating steps can be the same as for the first step or different. For example, the viscosity of the solution, dispersion or emulsion used for the second or subsequent coating layer may be lower than the viscosity of the solution, dispersion or emulsion used for the first coating.

The coated paper substrate has PPS smoothness in the range of from 0.1 to 8.0 μm, measured at 1.0 MPa. Preferably, the PPS smoothness is in the range of from 0.2 to 5.0 μm, such as in the range of from 0.4 to 2.0 μm. More Preferably, the PPS smoothness is in the range of from 0.5 to 5.0 μm, such as in the range of from 1.0 to 4.0 μm or from 1.0 to 3.0 μm.

The paper substrate according to the present invention preferably has a thickness, before coating, of less than 100 μm, such as less than 70 μm, less than 45 μm, less than 40 μm, or less than 35 μm. Thickness is determined according to ISO 3034.

The coated paper substrate according to the present invention preferably has a thickness of less than 100 μm, such as less than 70 μm, less than 45 μm, less than 40 μm, or less than 35 μm. Thickness is determined according to ISO 3034.

The paper substrate, after coating with cellulose ether, preferably has barrier properties such that the OTR (oxygen transmission rate) value (measured at standard conditions) of the paper substrate is preferably <200 cc/(m$^2$*day) measured at 50% RH, 23° C., preferably <150, more preferably <120 and most preferably <100 at a grammage of 10-50 gsm. The coated paper substrate typically has very high oil and grease barrier properties. Typically, chicken fat resistance is determined using a modification of ASTM F119-8 (flat specimen used, 2 parallel samples), performed at 60° C., of the coated paper substrate according to the present invention exceeds 48 hours.

The coated paper substrate may be provided on its own or be a part of a packaging material. The coated paper substrate may for example be part of a packaging material in the form of a multi-layer or multi-ply structure, wherein one layer or ply may be paperboard. For example, the coated paper substrate according to the present invention may be provided on a paperboard layer.

The coated paper substrate according to the present invention can for example be provided with a nano-coating on the side or sides coated with cellulose ether. The nano-coating is preferably atomic layer deposition (ALD), dynamic compound deposition (DCD), chemical vapor deposition (CVD), physical vapor deposition (PVD) and metal plasma-deposition. Preferably, the nano-coating is provided directly on the side or sides coated with cellulose ether. Alternatively, a pre-coating may be provided on the side or sides coated with cellulose ether prior to providing the nano-coating. Preferably, metal is provided as the nano-coating. More preferably, aluminum is provided as the nano-coating. After providing the nano-coating, the water vapor transmission rate of the packaging material, determined according to the standard ISO 15106-2/ASTM F1249 at 50% relative humidity and 23° C., is less than 5, more preferably less than 3.

Other components of a packaging materials may include materials such as thermoplastic polymers such as polypropylene or polyethylene, preferably bio-derived or derived from renewable resources such as PLA, PHA, PHB, PBS, cellulose acetate and modified starches. Further examples are waxes and hot melts. Additional examples include vinylic polymers (PVC and PVDC based), acrylate and styrene acrylate based polymers, acrylate/polyolefin copolymers, styrene copolymers, polyesters, polypropylene dispersions, ethylene copolymers (EAA and EMAA), ethylene terpolymer (EVA) or styrene acrylic latex or styrene butadiene latex. Such materials can be applied as a coating, for example by dispersion coating, extrusion coating or emulsion coating or by printing.

The coated paper substrate and/or the packaging material according to the present invention may be biodegradable and/or compostable. In this context, compostability is defined in accordance with ISO 18606, i.e. constituents in the whole material which are present at concentrations of less than 1% do not need to demonstrate biodegradability. However, the sum of such constituents shall not exceed 5%. Biodegradability is defined as follows: the ultimate aerobic biodegradability shall be determined for the whole material or for each organic constituent which is present in the material at a concentration of more than 1% (by dry mass). Constituents present at levels between 1 to 10% shall be tested individually.

The coated paper and/or packaging material according to the present invention can for example be used as a lid, liquid packaging product or pouch.

Microfibrillated cellulose (MFC) shall in the context of the patent application mean a nano scale cellulose particle fiber or fibril with at least one dimension less than 100 nm. MFC comprises partly or totally fibrillated cellulose or lignocellulose fibers. The liberated fibrils have a diameter less than 100 nm, whereas the actual fibril diameter or particle size distribution and/or aspect ratio (length/width) depends on the source and the manufacturing methods.

The smallest fibril is called elementary fibril and has a diameter of approximately 2-4 nm (see e.g. Chinga-Carrasco, G., *Cellulose fibres, nanofibrils and microfibrils: The morphological sequence of MFC components from a plant physiology and fibre technology point of view, Nanoscale research letters* 2011, 6:417), while it is common that the aggregated form of the elementary fibrils, also defined as microfibril (Fengel, D., *Ultrastructural behavior of cell wall polysaccharides*, Tappi J., March 1970, Vol 53, No. 3.), is the main product that is obtained when making MFC e.g. by using an extended refining process or pressure-drop disintegration process. Depending on the source and the manufacturing process, the length of the fibrils can vary from around 1 to more than 10 micrometers. A coarse MFC grade might contain a substantial fraction of fibrillated fibers, i.e. protruding fibrils from the tracheid (cellulose fiber), and with a certain amount of fibrils liberated from the tracheid (cellulose fiber).

There are different acronyms for MFC such as cellulose microfibrils, fibrillated cellulose, nanofibrillated cellulose, fibril aggregates, nanoscale cellulose fibrils, cellulose nanofibers, cellulose nanofibrils, cellulose microfibers, cellulose fibrils, microfibrillar cellulose, microfibril aggregates and cellulose microfibril aggregates. MFC can also be characterized by various physical or physical-chemical properties such as large surface area or its ability to form a gel-like material at low solids (1-5 wt %) when dispersed in water. The cellulose fiber is preferably fibrillated to such an extent that the final specific surface area of the formed MFC is from about 1 to about 300 m$^2$/g, such as from 1 to 200 m$^2$/g or more preferably 50-200 m$^2$/g when determined for a freeze-dried material with the BET method.

Various methods exist to make MFC, such as single or multiple pass refining, pre-hydrolysis followed by refining or high shear disintegration or liberation of fibrils. One or several pre-treatment step is usually required in order to make MFC manufacturing both energy efficient and sustainable. The cellulose fibers of the pulp to be supplied may thus be pre-treated enzymatically or chemically, for example to reduce the quantity of hemicellulose or lignin. The cellulose fibers may be chemically modified before fibrillation, wherein the cellulose molecules contain functional groups other (or more) than found in the original cellulose. Such groups include, among others, carboxymethyl (CM), aldehyde and/or carboxyl groups (cellulose obtained by N-oxyl mediated oxydation, for example "TEMPO"), or quaternary ammonium (cationic cellulose). After being modified or oxidized in one of the above-described methods, it is easier to disintegrate the fibers into MFC or nanofibrillar size fibrils.

The nanofibrillar cellulose may contain some hemicelluloses; the amount is dependent on the plant source. Mechanical disintegration of the pre-treated fibers, e.g. hydrolysed, pre-swelled, or oxidized cellulose raw material is carried out with suitable equipment such as a refiner, grinder, homogenizer, colloider, friction grinder, ultrasound sonicator, fluidizer such as microfluidizer, microfluidizer or fluidizer-type homogenizer. Depending on the MFC manufacturing method, the product might also contain fines, or nanocrystalline cellulose or e.g. other chemicals present in wood fibers or in papermaking process. The product might also contain various amounts of micron size fiber particles that have not been efficiently fibrillated. MFC is produced from wood cellulose fibers, both from hardwood or softwood fibers. It can also be made from microbial sources, agricultural fibers such as wheat straw pulp, bamboo, bagasse, or other non-wood fiber sources. It is preferably made from pulp including pulp from virgin fiber, e.g. mechanical, chemical and/or thermomechanical pulps. It can also be made from broke or recycled paper.

According to another embodiment, the suspension may comprise a mixture of different types of fibers, such as microfibrillated cellulose, and an amount of other types of fiber, such as kraft fibers, fines, reinforcement fibers, synthetic fibers, dissolving pulp, TMP or CTMP, PGW, etc.

The paper substrate may also comprise other process or functional additives, such as fillers, pigments, wet strength chemicals, dry strength chemicals, retention chemicals, cross-linkers, softeners or plasticizers, adhesion primers, wetting agents, biocides, optical dyes, fluorescent whitening agents, de-foaming chemicals, hydrophobizing chemicals such as AKD, ASA, waxes, resins etc. Additives can also be added using a size press.

EXAMPLES

Comparative Example 1

A thin substrate containing refined fibers and high amount of MFC were prepared so that the furnish (without chemicals) had a SR value of 90. A substrate was prepared thereof using a wet laid (dewatered on a fabric wire e.g. fourdrinier) method aiming for a grammage of 37 g/m². The Gurley Hill value was ca 11 400 (s/100 ml).

Comparative Example 2

A 34 g/m² base substrate based on comparative example 1 was supercalandered with an 11 nip Multical Supercalander running at 200 m/min. Pressure was 400 kN/m and web was moisturized with steam. The Gurley-Hill value for the calendered sample was 16 900 s/100 ml.

Example 1

The above base substrate (comparative example 1) was coated with a methylated nanocellulose (cellulose ether) at a concentration of ca 9.5 wt % using a rod coater (desk top coater). The coat weight was 4.0 g (1-side coated) and the obtained Gurley Hill value was 42300 which is max value for the used apparatus thus confirming a very dense substrate.

Example 2

The base from Comparative example 2 was treated with methylated nanocellulose at a coat weight of 2.9 g/m². The Gurley Hill value after treatment was 42 300 (max value) confirming a dense substrate after low coat weights. The cellulose ether used was a methylated cellulose which was obtained according to US20180319957A1.

Example 3 (Ethylated Nanocellulose Dissolved in a Solvent)

Ethylated nanocellulose was dissolved or dispersed in ethanol containing 92.1 wt % ethanol, 2.0 wt % methylethyl ketone and 5.9 wt % water The ethylated nanocellulose (MEC 1000; Innotech) solution was then applied with a brush on the surface of a MFC substrate as described above having Gurley-Hill value of 5500 s/100 ml. After the application of a coating layer, the film was allowed to dry in ambient air. The addition of one or two layers was tested. The application of only one layer of 1 or 5 wt % ethylated nanocellulose solution on top of the film was observed to seal the structure so that the Gurley-Hill value increased from 5500 s/100 ml to 42300 s/100 ml (the maximum value measurable with the L&W air permeability meter).

Example 4

When performing the same experiment as in example 3, but using a solvent substantially free from water (<0.5%), the same effect on Gurley Hill was seen, but also a further reduction in WVTR (water vapor transmission rate, determined according to the standard ISO 15106-2/ASTM F1249 at 50% relative humidity and 23° C.) to about 190 g/m²/day. Also, significantly less shrinking and wrinkling were seen.

Example 5 (Comparative)

A web was prepared comprising highly refined cellulose (70%) and bleached kraft pulp. The surface was not dense (Gurley Hill 14 800 s/100 ml) and the PPS (1.0 MPa) was relatively high at 7.9 µm.

Example 6 (Comparative)

The sample from Example 5 was calandered at a temperature of 150° C. and a line load of 150 kN/m using a lab calander. The roughness decreased to 2.8 µm(PPS; 1.0 MPa) and air permeability increased (28 400 s/100 ml).

Example 7 (Comparative)

In this case, the base web of Example 5 was coated with water and then dried and calandered as described in Example 6.

Example 8

In this example, a methyl nanocellulose (fluidized) was applied on the base web described in Example 5. The coat weight was approximately 6 g/m2. The sample was then dried and calandered as described in Example 6. In this case, the air permeability value was 42 300 s/100 ml which is the maximum value with the device and thus confirming a dense substrate. The PPS roughness was 2.4 µm(PPS 1.0 MPa). The OTR value was significantly improved confirming a dense substrate.

| Coating | Calendering (° C./kN/m) | Gurley-Hill (s/100 ml) | PPS (1.0 MPa) | OTR (cc/m²/day, 23° C., 50% RH) | Oil/grease resistance, 60° C., chicken fat* | Thickness, μm |
|---|---|---|---|---|---|---|
| None | None | 14800 | 7.9 | | 0-15 min | 45 |
| | 150/150 | 28400 | 2.8 | | | 36 |
| MeNC | None | 42300 | 7.8 | 1317 | >56 h | 64 |
| | 150/150 | 42300 | 2.4 | 104 | 48 h | 45 |

*Chicken fat resistance determined using a modification of ASTM F119-8, performed at 60° C.

This confirms that methyl cellulose or methyl nanocellulose as well as ethyl cellulose or ethyl nanocellulose can act as a film forming agent providing a good and dense substrate for e.g. vacuum deposition.

In view of the above detailed description of the present invention, other modifications and variations will become apparent to those skilled in the art. However, it should be apparent that such other modifications and variations may be effected without departing from the spirit and scope of the invention.

The invention claimed is:

1. A coated paper substrate comprising:
   a paper substrate with a coated surface with a coating comprising a cellulose ether, wherein the cellulose ether is methyl nanocellulose or ethyl nanocellulose and wherein the coating has been applied as a suspension, solution, emulsion, or foam, and wherein at least 80 wt % of a solvent used in said suspension, solution, emulsion, or foam is non-aqueous,
   wherein the coated surface has a Parker Print Surf (PPS) smoothness, determined according to ISO 8791-4 at 1.0 MPa, in a range of from 0.1 to 8.0 μm, and
   wherein the paper substrate has a grammage in the range of from 15 g/m² to 100 g/m².

2. The coated paper substrate according to claim 1, wherein the PPS smoothness is in the range of from 0.4 to 5.0 μm.

3. The coated paper substrate according to claim 2, wherein the PPS smoothness is in the range of from 1.0 to 3.0 μm.

4. The coated paper substrate according to claim 1, wherein the coated surface comprises a root-mean-square (RMS) roughness less than 100 nm.

5. The coated paper substrate according to claim 1, wherein an amount of the coating applied is in a range of from 1 g/m² to 8 g/m².

6. The coated paper substrate according to claim 1, wherein a thickness of the coated paper substrate is less than 70 μm.

7. The coated paper substrate according to claim 1, wherein the grammage is in the range of from 20 g/m² to 45 g/m².

8. The coated paper substrate according to claim 1, wherein the paper substrate comprises at least 60% by weight of microfibrillated cellulose.

9. The coated paper substrate according to claim 1, wherein the paper substrate, prior to coating, has barrier properties such that the Gurley Hill porosity value of the film is higher than 4000 s/100 ml.

10. The coated paper substrate according to claim 1, wherein the paper substrate comprises less than a total of 5 wt % plastic material or other fossil-based material.

11. The coated paper substrate according to claim 1, wherein the viscosity of the suspension, solution, emulsion, or foam is less than 800 mPa·s.

12. The coated paper substrate according to claim 1, wherein the coated paper substrate has moisture barrier properties such that the oxygen transmission rate (OTR) value measured at 50% relative humidity and 23° C. less than 200 cc/m²·day at a grammage of 10 to 50 gsm.

13. The coated paper substrate according to claim 1, wherein the coated surface is further coated by metallization or other nano-coating.

14. The coated paper substrate according to claim 13, wherein the water vapor transmission rate of the packaging material, determined according to the standard ISO 15106-2/ASTM F1249 at 50% relative humidity and 23° C. is less than 5.

15. A packaging material comprising:
   the coated paper substrate according to claim 1.

16. The packaging material according to claim 15, wherein the packaging material is a multilayer or multiply structure, wherein one layer or ply may be paperboard.

17. A method of manufacturing a coated paper substrate, the method comprising the steps of:
   a) providing a paper substrate having a grammage in a range from 15 g/m² to 100 g/m²,
   b) coating the paper substrate of step a) with a coating comprising cellulose ether, wherein the cellulose ether is methyl nanocellulose or ethyl nanocellulose, applied as a suspension, solution, emulsion, or foam, and wherein at least 80 wt % of a solvent used in said suspension, solution, emulsion, or foam is non-aqueous, as on at least one side of the paper substrate to obtain a coated paper having at least one coated surface having a Parker Print Surf (PPS) smoothness, determined according to ISO 8791-4 at 1.0 MPa, in a range of from 0.1 to 8.0 μm.

18. The method according to claim 17, wherein an amount of the coating applied is in a range of from 1 g/m² to 8 g/m².

19. The method according to claim 17, further comprising the step of:
   c) metallization or other nano-coating applied via atomic layer deposition (ALD), dynamic compound deposition (DCD), chemical vapor deposition (CVD), physical vapor deposition (PVD), or metal plasma-deposition.

20. The method of manufacturing a packaging material, comprising:
   providing a coated paper substrate manufactured according to the method of claim 17.

* * * * *